United States Patent [19]
Choquette et al.

[11] Patent Number: 5,951,372
[45] Date of Patent: Sep. 14, 1999

[54] METHOD OF ROUGHING A METALLIC SURFACE OF A SEMICONDUCTOR DEPOSITION TOOL

[75] Inventors: Scott F. Choquette; Timothy J. Daniel; Cristin A. Wolfson, all of Orlando, Fla.

[73] Assignee: Lucent Technologies Inc., Murray Hill, N.J.

[21] Appl. No.: 08/970,298

[22] Filed: Nov. 14, 1997

[51] Int. Cl.⁶ ........................................... B24B 1/00
[52] U.S. Cl. ..................... 451/38; 204/192.32; 451/54; 451/39
[58] Field of Search ................... 451/38, 39, 40, 451/54; 204/192.32, 192.33, 192.34, 192.35

[56] References Cited

U.S. PATENT DOCUMENTS

| | | | |
|---|---|---|---|
| 1,610,927 | 12/1926 | Butler | 451/38 |
| 2,248,530 | 7/1941 | Granger et al. | 451/39 X |
| 3,939,613 | 2/1976 | Ayers | 451/39 |
| 4,035,962 | 7/1977 | Ayers | 451/39 X |
| 4,714,528 | 12/1987 | Takeuchi et al. | 451/40 X |
| 4,851,091 | 7/1989 | Uesugi et al. | 451/38 X |
| 4,909,894 | 3/1990 | Uesugi et al. | 451/40 X |
| 5,202,008 | 4/1993 | Talieh et al. | 451/38 X |
| 5,641,543 | 6/1997 | Brooks | 451/39 X |
| 5,690,539 | 11/1997 | Swidler et al. | 451/39 X |

Primary Examiner—Timothy V. Eley

[57] ABSTRACT

The present invention provides a method of roughing a metallic surface. In one embodiment, the method includes the steps of positioning a pressurized grit source a predetermined distance from and at an angle substantially perpendicular to the metallic surface of the object that is to be roughened, projecting grit from the pressurized grit source against the metallic surface, forming a grit impact area, which in certain embodiments may be seven inches square, on the metallic surface, and moving the pressurized grit source from the grit impact area after an amount of time that ranges from about three seconds to about eight seconds.

27 Claims, 3 Drawing Sheets

FIG. 1A
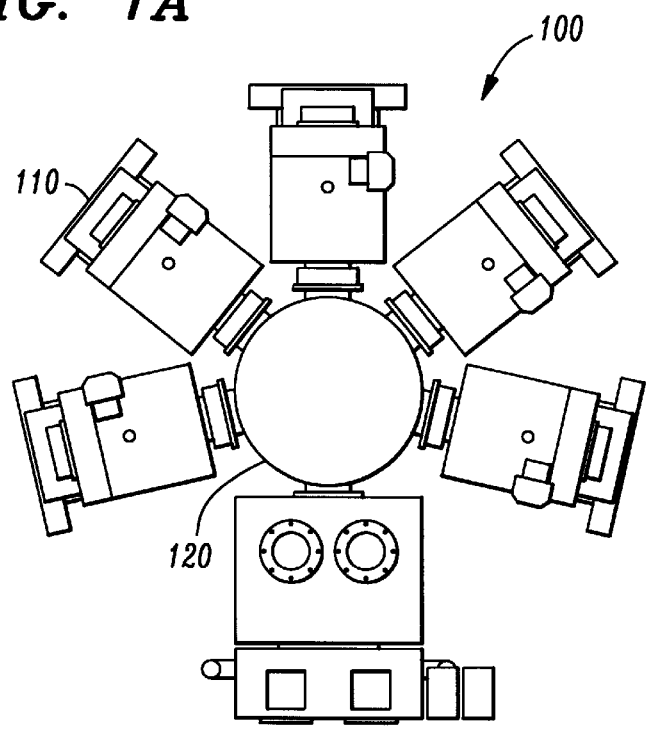
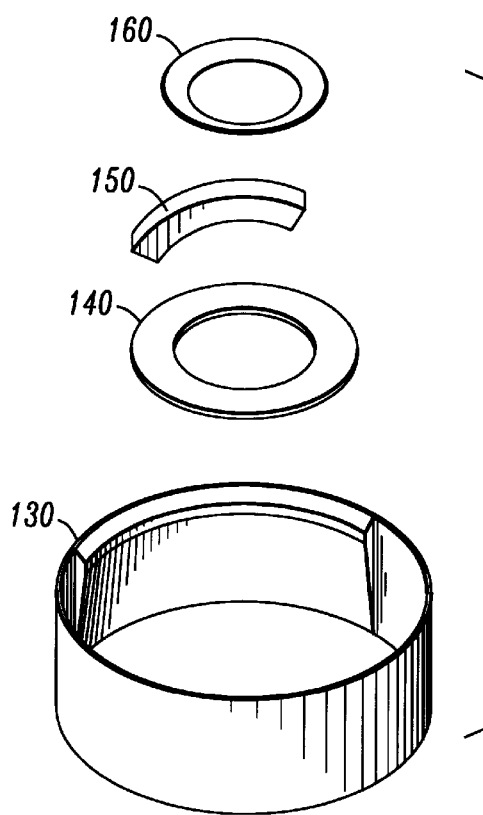
FIG. 1B

SURFACE ROUGHNESS VS. BLAST TIME

SURFACE ROUGHNESS VS. PRESSURE FOR VARIOUS TIMES

# METHOD OF ROUGHING A METALLIC SURFACE OF A SEMICONDUCTOR DEPOSITION TOOL

TECHNICAL FIELD OF THE INVENTION

The present invention is directed, in general, to method of roughing a metallic surface of a deposition tool, and more specifically to a method of grit blasting a stainless steel shield of a physical vapor deposition tool.

BACKGROUND OF THE INVENTION

Currently, the most widely utilized deposition technique for a variety of metallic films in Very Large Scale Integration (VSLI) fabrication is sputtering. Sputtering is a physical vapor deposition (PVD) mechanism whereby material is removed, as atoms or molecules, from a solid target by energetic ion bombardment and deposited as atomic layers on a substrate. PVD involves ionization of argon gas at a low pressure through the use of an electric field. Positive argon ions are accelerated into a negatively charged plate called the target. When these ions strike the target plate, atoms of the target material are sputtered off and then recondense on ambient surfaces to form thin films. Other basic modes of sputtering includes DC magnetron, RF magnetron, RF diode and RF triode. The DC magnetron mode of sputtering has been a popular method of depositing aluminum since the late 1970's. However, by using RF power instead of DC, target materials that are not conductors may be deposited. RF energy is applied to the back surface of the target and is capacitively coupled to the front surface. The difference in mobility between the electrons and ions in the RF formed plasma, causes the surface of the insulating target to acquire a net negative charge of several thousand volts. Positively charged argon ions in the plasma are attracted to the surface of the target causing sputtering to occur.

During the sputtering process, not only is the metallic material deposited on the substrate, but also, on shields used in the sputtering tool to protect the chamber surfaces from the sauttered material. The metallic materials adhere to the shields and over a period of time will "flake" off the shields onto the wafers that are present in the sputtering tool and contaminate the wafers. Of course, as is well known, it is extremely important that the wafer remain as contaminant-free as possible to assure high quality and reliability of the semiconductor devices that are typically formed on the wafer. To minimize the contamination from the shields, the shields are periodically removed and cleaned, in accordance with the manufacturer's specifications.

The cleaning process includes a step to roughen the shield's surfaces to approximately 80 to 120 μinches, typical manufacturers' specification for this type of shields. For certain materials, e.g., titanium nitride (TiN), however, a rougher shield, i.e., greater than 200 μinches, is more desirable because TiN adheres more readily to a rougher surface. Currently, available cleaning processes will not achieve the level of roughness desired primarily because of the thickness of the shields, which is typically 0.040 inches. To achieve the level of roughness desired, the relatively thin shields will be damaged by the roughing process.

SUMMARY OF THE INVENTION

To address the deficiencies of prior art methods, the present invention provides a method of roughing a metallic surface. In one embodiment, the method includes the steps of positioning a pressurized grit source a predetermined distance from and at an angle substantially perpendicular to the metallic surface of the object that is to be roughened and projecting grit, which has a grit size ranging from twenty-five to forty-seven, from the pressurized grit source against the metallic surface at a velocity sufficient to form an indentation on the metallic surface that has a depth of at least about 160 micro inches. This particular embodiment may further include the step of moving the pressurized girt source across the metallic surface.

In one embodiment, the step of positioning includes the step of positioning the pressurized grit source from the metallic surface at a distance ranging from about four inches to about six inches. In one particular embodiment, the grit may be aluminum oxide, and the step of projecting grit includes projecting a grit having a grit size of about thirty-six. The pressure at which the grit is projected may vary depending on several factors. However, in one particular embodiment, the method further includes the step of using a pressure that ranges from about seventy psi to ninety psi to project the grit.

In one embodiment, the metallic surface is a stainless shield from a physical vapor deposition tool. In one particular aspect of this embodiment, the stainless steel shield may have a thickness of about one-forty thousandths of an inch.

In one embodiment, the step of projecting may include the step of forming a grit impact area of about seven square inches on the metallic surface. In this particular embodiment, the grit source may be positioned over the grit impact area for a period of time ranging from about three second to about eight seconds. In an advantageous embodiment, however, the period of time is about five seconds.

In another embodiment, the step of projecting the grit includes producing a roughness in the metallic surface having a depth that is greater than about two-hundred micro inches, and in a further aspect the depth may range from about two hundred-forty micro inches to about two hundred-seventy micro inches.

In yet another embodiment, the angle substantially perpendicular to the metallic surface ranges from about eighty degrees to about one hundred degrees.

BRIEF DESCRIPTION OF THE DRAWINGS

For a more complete understanding of the present invention, reference is now made to the following descriptions taken in conjunction with the accompanying drawings, in which:

FIG. 1A illustrates an exemplary clustered sputtering tool that includes a plurality of process chambers and a transfer module;

FIG. 1B illustrates exemplary shield and clamp components employed in the sputtering tool;

DETAILED DESCRIPTION

Figure 2:
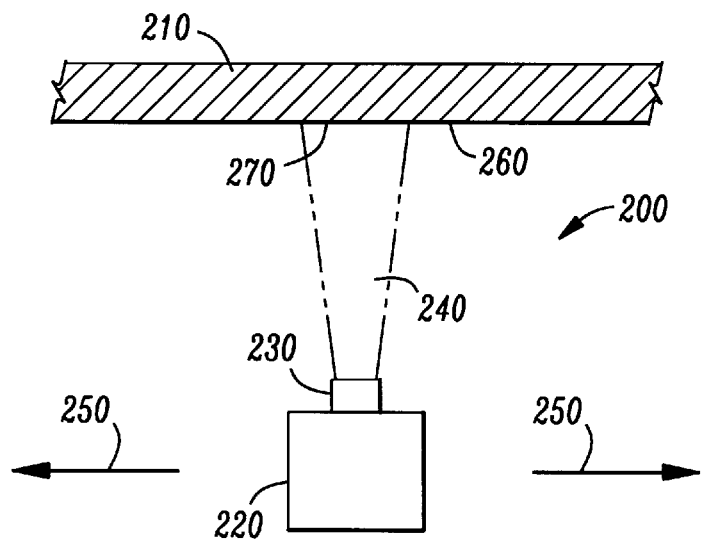
FIG. 2 illustrates an embodiment of a metallic surface roughing process in accordance with the principles of the present invention.

Referring initially to FIGS. 1A and 1B, FIG. 1A illustrates a conventional clustered sputtering tool 100 that includes a plurality of process chambers (one of which is designated 110) and a transfer module 120. FIG. 1B illustrates conventional shield and clamp components employed in the sputtering tool 100. The shield and clamp components include a deposition shield 130, an upper ring shield 140, a pass through shield 150 and a wafer clamp 160.

In a conventional application, the deposition shield 130 is used in the process chamber 110 and is placed around the chuck (not shown) on which a semiconductor wafer rests. The pass through shield 150 is secured to the upper ring shield 140, and the wafer clamp 160 is positioned in the center of the upper ring shield 140. During a deposition process, the wafer is introduced into the process chamber 110 through the transfer module 120. The wafer is then placed on the chuck through a slit on the wall of the deposition shield 130, also called a "pass through." The upper ring shield 140 along with the pass through shield 150 and the wafer clamp 160 are then lowered onto the wafer to secure the wafer and shield the opening through which the wafer was delivered.

As previously mentioned, during the sputtering process, materials are not only deposited on the wafer, but also, are deposited on the shield components 130, 140, 150, & 160. For certain materials, such as TiN, if the deposition shield 130 is not sufficiently rough, e.g., greater than 200 $\mu$inches, the material may not adhere to the shield components 130, 140, 150, & 160 and might flake off the shield components 130, 140, 150, & 160 onto the wafer, thus contaminating the wafer. Presently, in most cases, the manufacturers of these clustered sputtering tools 100 do not provide a sufficient degree of roughness on the shield components 130, 140, 150, & 160. This is primarily due to the fact that present roughening processes either damage the shield components or make the shield too smooth, either of which can have detrimental effects on the overall manufacturing process. If the shield is roughened too extensively, the shield components 130, 140, 150, & 160 may be penetrated by the blasting material. The ease with which the shield components 130, 140, 150, & 160 may be penetrated is primarily due to the fact that these shield are relatively thin; in most cases, for instance the shield will typically have a thickness of about 0.040 inches. On the other hand, if the shield is blasted for long periods of time, the cleaning process may produce a relatively smooth surface, which readily allows sputtering materials to flake off onto the wafer.

To remedy the foregoing problems, the present invention provides, in an advantageous embodiment, a method of roughing a metallic surface of shield components 130, 140, 150, & 160. This particular aspect of the present invention will now be discussed in detail.

Turning now to FIG. 2, illustrated is an embodiment of a metallic surface roughing process 200 in accordance with the principles of the present invention. The metallic surface roughing process 200 includes a conventional pressurized grit source 220 with a nozzle 230, from which a plurality of grit (generally designated 240) is sprayed onto a metallic surface 260 of a section of a deposition shield 210. For illustrative purposes only, the deposition shield 210 is shown to be a flat surface, however, it should be understood that the deposition shield 210 will typically be a curved surface as illustrated in FIG. 1B.

In an advantageous embodiment, the deposition shield 210 is a stainless steel shield, with a thickness of approximately one-forty thousands of an inch, typically used in a physical vapor deposition tool. The pressurized grit source 220, such as a vacuum-type bead blast tool, is positioned at a distance of approximately four to six inches from the metallic surface 260, at an angle of approximately 90°±10°. If the pressurized grit source 220 is positioned at angles that deviate substantially from the above-specified range of angles, the resultant metallic surface 260 from the roughing process may have a directional dependent roughness. This directional dependent roughness may not have the desired effect of facilitating the adhesion of the metallic atoms or molecules, which are traveling in certain directions, to the metallic surface 260, when the deposition shield 210 is employed in the sputtering tool. In an advantageous embodiment, the pressurized grit source 220, when projecting the plurality of grit 240 onto the deposition shield 210, is translated across the metallic surface 260 in the directions depicted by a plurality of direction arrows 250 analogous to a "sweeping" motion.

The plurality of grit 240 used in the roughing process is typically aluminum oxide with a grit size between 25 and 47 and in an advantageous embodiment of the process, a 36 grit size is used. The grit 240 is projected onto the metallic surface 260 at a velocity sufficient to create an indentation, of at least about 160 $\mu$inches, on the metallic surface 260. In another embodiment, the indentations created on the metallic surface have a depth greater than about 200 $\mu$inches. This minimum indentation may be achieved with the pressurized grit source 220 pressurized at approximately 80 psi, ±10 psi. The relationship between the blast time and the metallic surface roughness obtained is illustrated in FIG. 3, with continuing reference to FIG. 2.

Figure 3:
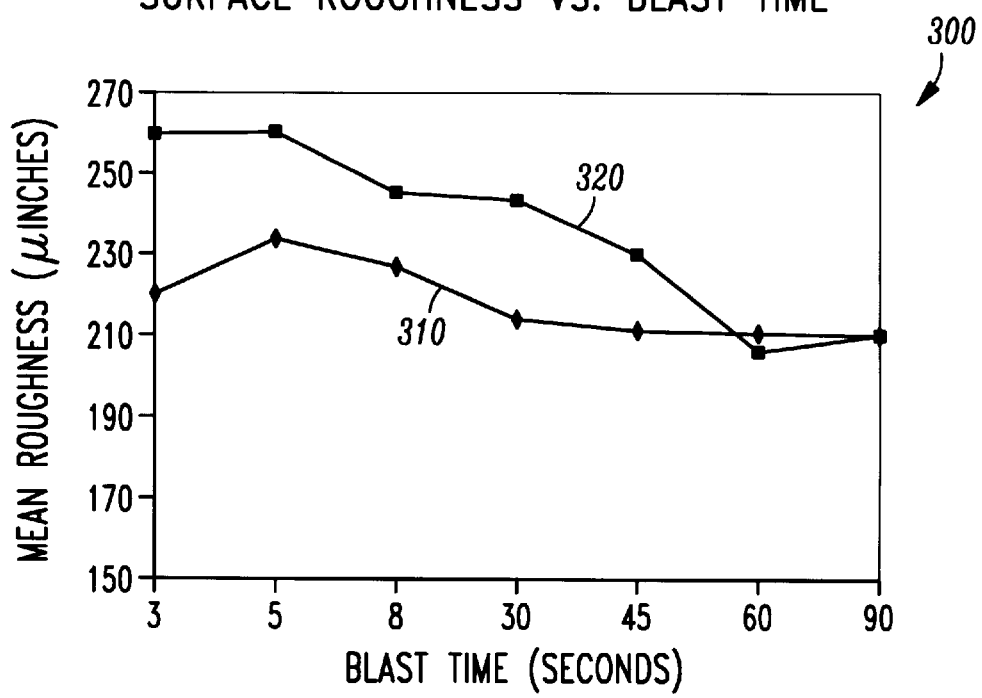
FIG. 3 illustrates exemplary graphs depicting surface roughness of metallic surfaces resulting from using an embodiment of a metallic surface roughing process illustrated in FIG. 1 for different blast periods and using different pressures in the pressurized grit source.

Turning now to FIG. 3, illustrated are exemplary graphs 300 depicting surface roughness of metallic surfaces resulting from using an embodiment of a metallic surface roughing process illustrated in FIG. 1 for different blast periods and using different pressures in the pressurized grit source. The metallic surface roughing process employed 36 grit composed of aluminum oxide. A first graph 310 depicts the surface roughness of a metallic surface using a 75 psi pressurized grit source. A second graph 320 depicts the surface roughness of a metallic surface when a 85 psi pressurized grit source was employed.

The first and second graphs 310, 320 illustrate that the surface roughness obtained using different pressures are increasing from a minimum blast time of approximately 3 seconds to a peak surface roughness obtained when a blast time of approximately 5 seconds is used. After approximately 5 seconds, the surface roughness obtained begins to decrease, i.e., smooth, for both pressure values used.

The optimum indentation, or roughness, is approximately 240 to about 270 $\mu$inches and the resulting grit impact area 270 on the metallic surface 260, at least in an advantageous embodiment, is approximately seven square inches. However, it should be understood that the size of the impact area 270 may vary depending on operation parameters. For instance the opening in the nozzle 230 may vary the size of the impact area 270 or the speed at which the sweeping motion is conducted may also vary the size of the impact area. Preferably, the pressurized grit source 220 is not positioned over any particular grit impact area 270 for any time period less than three seconds or more than eight seconds, when the plurality of grit 240 is being projected onto the metallic surface 260. If the plurality of grit 240 is projected onto the metallic surface 260 for blast times of greater than eight seconds, the process may begin to smooth the metallic surface instead of roughing the metallic surface. Additionally, the greater the period of time, the greater the likelihood of damage to the metallic surface from the force of impact of the grit. On the other hand, if a time period of less than three seconds is employed, the minimum surface roughness desired, i.e., 160 μinches, may never be achieved. In an advantageous embodiment, the plurality of grit 240 is projected onto the grit impact area for a time period of approximately five seconds.

Figure 4:
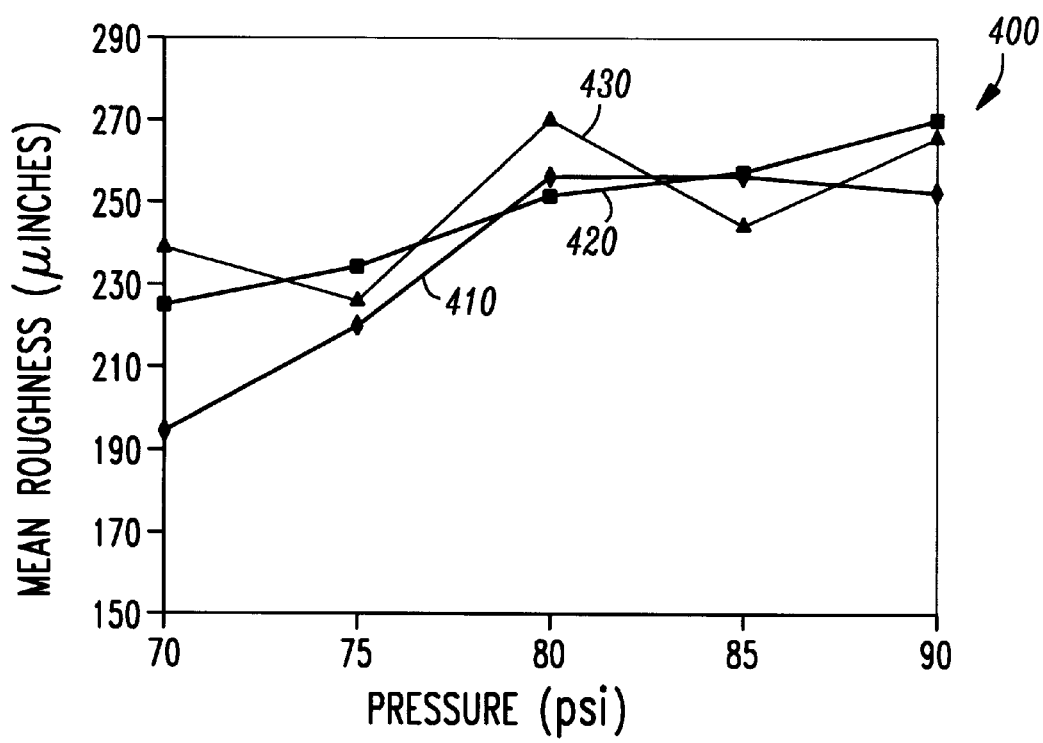
FIG. 4 illustrates exemplary graphs depicting surface roughness obtained using different pressure settings and for different blast time periods.

Turning now to FIG. 4, illustrated are exemplary graphs 400 depicting surface roughness obtained using different pressure settings and for different blast time periods. A first graph 410 depicts the resulting surface roughness obtained for different pressure settings with a blast time of 3 seconds. Similarly, second and third graphs 420, 430 depict surface roughness for different pressure settings with blast times of 5 and 8 seconds, respectively.

The first, second and third graphs 410, 420, 430 illustrate that over a pressure range, from 70 psi to 90 psi, used to propel the grit onto a metallic surface, the resulting surface roughness of the metallic surface is greater than 190 μinches for all three blast time periods. Additionally, for the first and third graphs 410, 430, the peak surface roughness was obtained at about 80 psi.

From the above, it is apparent that the present invention provides a method of roughing a metallic surface. The method includes the steps of positioning a pressurized grit source a predetermined distance from and at an angle substantially perpendicular to the metallic surface of the object that is to be roughened and projecting grit, which has a grit size ranging from twenty-five to forty-seven, from the pressurized grit source against the metallic surface at a velocity sufficient to form an indentation on the metallic surface that has a depth of at least about 160 micro inches.

The foregoing has outlined, rather broadly, preferred and alternative features of the present invention so that those skilled in the art may better understand the detailed description of the invention as stated herein. Moreover, those skilled in the art should appreciate that they can readily use the disclosed conception and specific embodiment as a basis for designing or modifying other structures for carrying out the same purposes of the present invention. Those skilled in the art should also realize that such equivalent constructions do not depart from the spirit and scope of the invention in its broadest form.

What is claimed is:

1. A method of roughing a metallic surface of a shield of a physical vapor disposition tool, comprising:
    positioning a pressurized grit source a predetermined distance from and at an angle substantially perpendicular to said metallic surface;
    projecting grit having a grit size ranging from twenty-five to forty-seven from said pressurized grit source against said metallic surface at a velocity sufficient to form an indentation on said metallic surface having a depth of at least about 160 micro inches.

2. The method as recited in claim 1 wherein positioning includes positioning said pressurized grit source from said metallic surface at a distance ranging from about four inches to about six inches.

3. The method as recited in claim 1 wherein projecting includes projecting grit having a thirty-six grit size.

4. The method as recited in claim 1 wherein projecting includes projecting aluminum oxide against said metallic surface.

5. The method as recited in claim 1 wherein projecting includes using a pressure ranging from about seventy psi to ninety psi to project said grit.

6. The method as recited in claim 1 wherein said shield is a stainless steel shield.

7. The method as recited in claim 6 wherein said stainless steel shield has a thickness of about one-forty thousandths of an inch.

8. A stainless steel shield produced from the method of claim 6.

9. The method as recited in claim 1 wherein projecting includes forming a grit impact area of about seven square inches on said metallic surface.

10. The method as recited in claim 9 wherein projecting includes positioning said grit source over said grit impact area for a period of time ranging from about three seconds to about eight seconds.

11. The method as recited in claim 10 wherein said period of time is about five seconds.

12. The method as recited in claim 1 wherein projecting said grit includes producing an indentation in said metallic surface having a depth greater than about two-hundred micro inches.

13. The method as recited in claim 12 wherein said depth ranges from about two hundred-forty micro inches to about two hundred-seventy micro inches.

14. The method as recited in claim 1 wherein said angle substantially perpendicular to said metallic surface ranges from about eighty degrees to about one hundred degrees.

15. The method as recited in claim 1 further including moving said pressurized grit source across said metallic surface.

16. A method of roughing a surface of a stainless steel shield of a physical vapor deposition tool, comprising:
    positioning a pressurized grit source a distance from said surface that ranges from about four inches to six inches and at an angle substantially perpendicular to said surface;
    projecting grit having a size ranging from about thirty to about forty from said pressurized grit source against said surface at a velocity sufficient to form an indentation in said surface having a depth that is at least 160 micro inches; and
    moving said pressurized grit source across said surface as said grit is projected from said pressurized grit source.

17. The method as recited in claim 16 wherein positioning includes positioning said pressurized grit source from said surface at a distance of about six inches.

18. The method as recited in claim 16 wherein (said step of) projecting said grit includes projecting grit having a grit size of about thirty-six.

19. The method as recited in claim 16 wherein projecting includes projecting aluminum oxide against said surface.

20. The method as recited in claim 16 further including using a pressure that ranges from about seventy psi to ninety psi to project said grit.

21. The method as recited in claim 16 wherein projecting said grit includes forming an indentation having a depth that is greater than about two-hundred micro inches.

22. The method as recited in claim 16 wherein said stainless steel shield has a thickness of about one-forty thousandths of an inch.

23. The method as recited in claim 16 wherein projecting includes forming a grit impact area of about 7 square inches on said metallic surface.

24. The method as recited in claim 23 wherein projecting includes positioning said grit source over said grit impact area for a period of time ranging from about three seconds to about 8 seconds.

25. The method as recited in claim 24 wherein said projecting includes forming an indentation having a depth that ranges from about two hundred-forty micro inches to about two hundred-seventy micro inches.

26. The method as recited in claim 16 wherein said angle substantially perpendicular to said surface ranges from about eighty degrees to about one hundred degrees.

27. The method as recited in claim 16 wherein moving includes substantially uniformly moving said pressurized grit source across said surface.

* * * * *